(12) United States Patent
Zhi et al.

(10) Patent No.: US 11,329,574 B2
(45) Date of Patent: May 10, 2022

(54) ENERGY HARVESTING AND STORAGE APPARATUS AND A METHOD OF FORMING THEREOF

(71) Applicant: City University of Hong Kong, Kowloon (HK)

(72) Inventors: Chunyi Zhi, New Territories (HK); Zifeng Wang, Kowloon (HK)

(73) Assignee: City University of Hong Kong, Kowloon (HK)

(*) Notice: Subject to any disclaimer, the term of this patent is extended or adjusted under 35 U.S.C. 154(b) by 442 days.

(21) Appl. No.: 15/980,889

(22) Filed: May 16, 2018

(65) Prior Publication Data
US 2019/0356243 A1    Nov. 21, 2019

(51) Int. Cl.
  *H02N 1/04*    (2006.01)
  *H01M 4/42*    (2006.01)
  (Continued)

(52) U.S. Cl.
  CPC ............ *H02N 1/04* (2013.01); *A41D 1/002* (2013.01); *H01M 4/42* (2013.01); *H01M 4/50* (2013.01); *H01M 10/054* (2013.01); *H01M 10/44* (2013.01); *A41D 31/00* (2013.01); *A41D 2500/10* (2013.01); *B32B 5/026* (2013.01); *B32B 5/26* (2013.01); *B32B 7/08* (2013.01);
  (Continued)

(58) Field of Classification Search
  CPC .......... H02N 1/04; H02N 2/18; H01M 4/244; H01M 4/38; H01M 4/5042; H01M 10/0436; H01M 10/46; H01M 2250/402; B32B 5/026; B32B 5/26; B32B 7/08; B32B 2307/202; B32B 2457/10; B32B 2250/20; B32B 2262/0261; B32B 2262/0276; B32B 2262/106; A41D 1/002; A41D 31/00; A41D 2500/10; D04B 21/207; D10B 2331/02; D10B 2331/04
  See application file for complete search history.

(56) References Cited

U.S. PATENT DOCUMENTS 6,187,475 B1 * 2/2001 Oh .................. H01M 4/62
                                              429/205
6,432,585 B1 * 8/2002 Kawakami ........... H01M 4/244
                                              429/233
(Continued)

OTHER PUBLICATIONS

Pu et al., "A Self-Charging Power Unit by Integration of a Textile Triboelectric Nanogenerator and a Flexible Lithium Ion Battery for Wearable Electronics", Advance Mater, 2015, pp. 2472-2478 (Year: 2015).*
(Continued)

*Primary Examiner* — Quyen P Leung
*Assistant Examiner* — Eric Johnson
(74) *Attorney, Agent, or Firm* — Renner Kenner Greive Bobak Taylor & Weber

(57) ABSTRACT

A system and a method for an energy harvesting and storage apparatus including a flexible substrate, an energy harvesting device disposed on the flexible substrate, the energy harvesting device is configured to convert mechanical energy into electrical energy, an energy storage device disposed on the flexible substrate and in electrical communication with the energy harvesting device and configured to receive and store the electrical energy from the energy harvesting device.

22 Claims, 11 Drawing Sheets

(51) Int. Cl.
*H01M 4/50* (2010.01)
*A41D 1/00* (2018.01)
*A41D 31/00* (2019.01)
*H01M 10/054* (2010.01)
*H01M 10/44* (2006.01)
*D04B 21/20* (2006.01)
*H02N 2/18* (2006.01)
*B32B 5/02* (2006.01)
*B32B 5/26* (2006.01)
*B32B 7/08* (2019.01)

(52) U.S. Cl.
CPC ... *B32B 2250/20* (2013.01); *B32B 2262/0261* (2013.01); *B32B 2262/0276* (2013.01); *B32B 2262/106* (2013.01); *B32B 2307/202* (2013.01); *B32B 2457/10* (2013.01); *D04B 21/207* (2013.01); *D10B 2331/02* (2013.01); *D10B 2331/04* (2013.01); *H02N 2/18* (2013.01)

(56) References Cited

U.S. PATENT DOCUMENTS

| | | | | |
|---|---|---|---|---|
| 2014/0338458 A1* | 11/2014 | Wang | | G01H 11/06 73/658 |
| 2016/0036351 A1* | 2/2016 | Kim | | H02N 1/04 73/514.32 |
| 2016/0111755 A1* | 4/2016 | Liu | | H01M 10/36 429/152 |
| 2016/0149518 A1* | 5/2016 | Wang | | H02N 1/04 310/310 |
| 2016/0165970 A1* | 6/2016 | Jost | | H01G 11/28 219/211 |
| 2016/0346556 A1* | 12/2016 | Slepian | | A61N 1/3785 |
| 2017/0331396 A1* | 11/2017 | Byun | | H02N 1/04 |
| 2018/0103703 A1* | 4/2018 | Rinne | | A41D 13/0012 |

OTHER PUBLICATIONS

Song et al., "Integrated Self Charging Power Unit With Flexible Supercapacitor and Triboelectric Nanogenerator", Journal of Materials Chemistrty A, 2016, pp. 14298-14306 (Year: 2016).*
Soin et al., Novel 3D Spacer All Fibre Piezoelectric Textiles for Energy Harvesting Applications, Energy Environ. Sci., 2014, 7, 1670 (Year: 2014).*
Hongfei Li et al; (2018) An extremely safe and wearable solid-state zinc ion battery based on a hierarchical structured polymer electrolyte. Energy & Environmental Science, DOI: 10.1039/C7EE03232C.
Pu, Xiong et al; (2015) A Self-charging power unit by integration of a textile triboelectric nanogenerator and a flexible lithium-ion battery for wearable electronics, Advanced Materials, 27(15), 2472-2478.
Wang, Jie et al; (2015) A Flexible Fiber-Based Supercapacitor-Triboelectric-Nanogenerator Power System for Wearable Electronics, Advanced Materials, 27(33), 4830-4836.

* cited by examiner

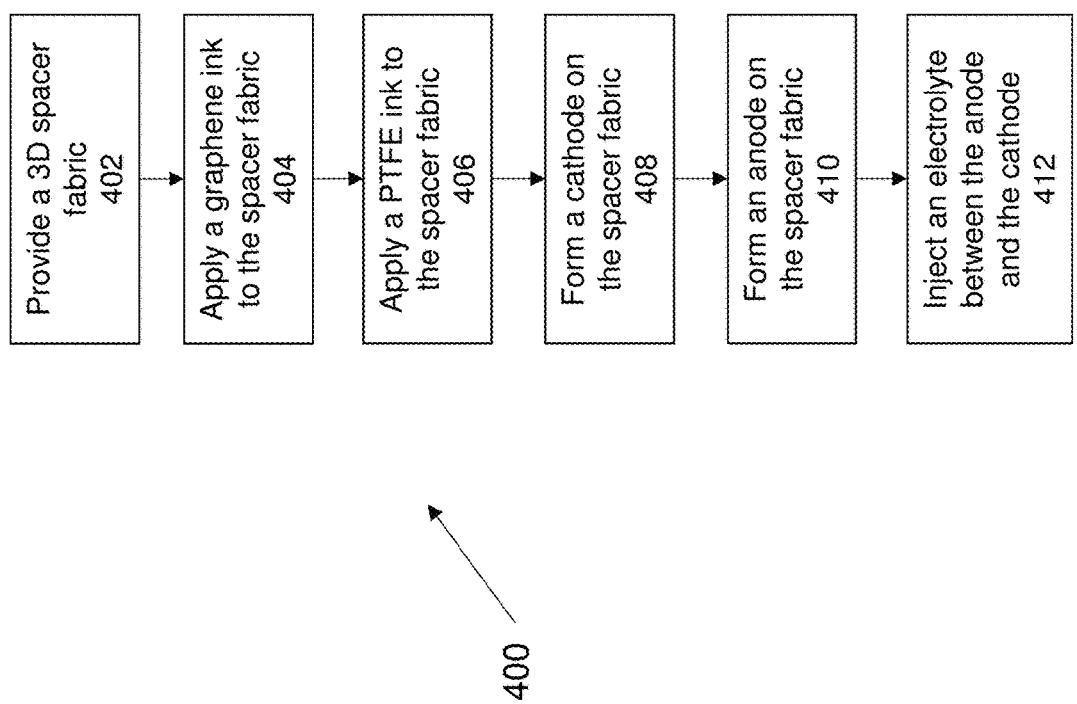

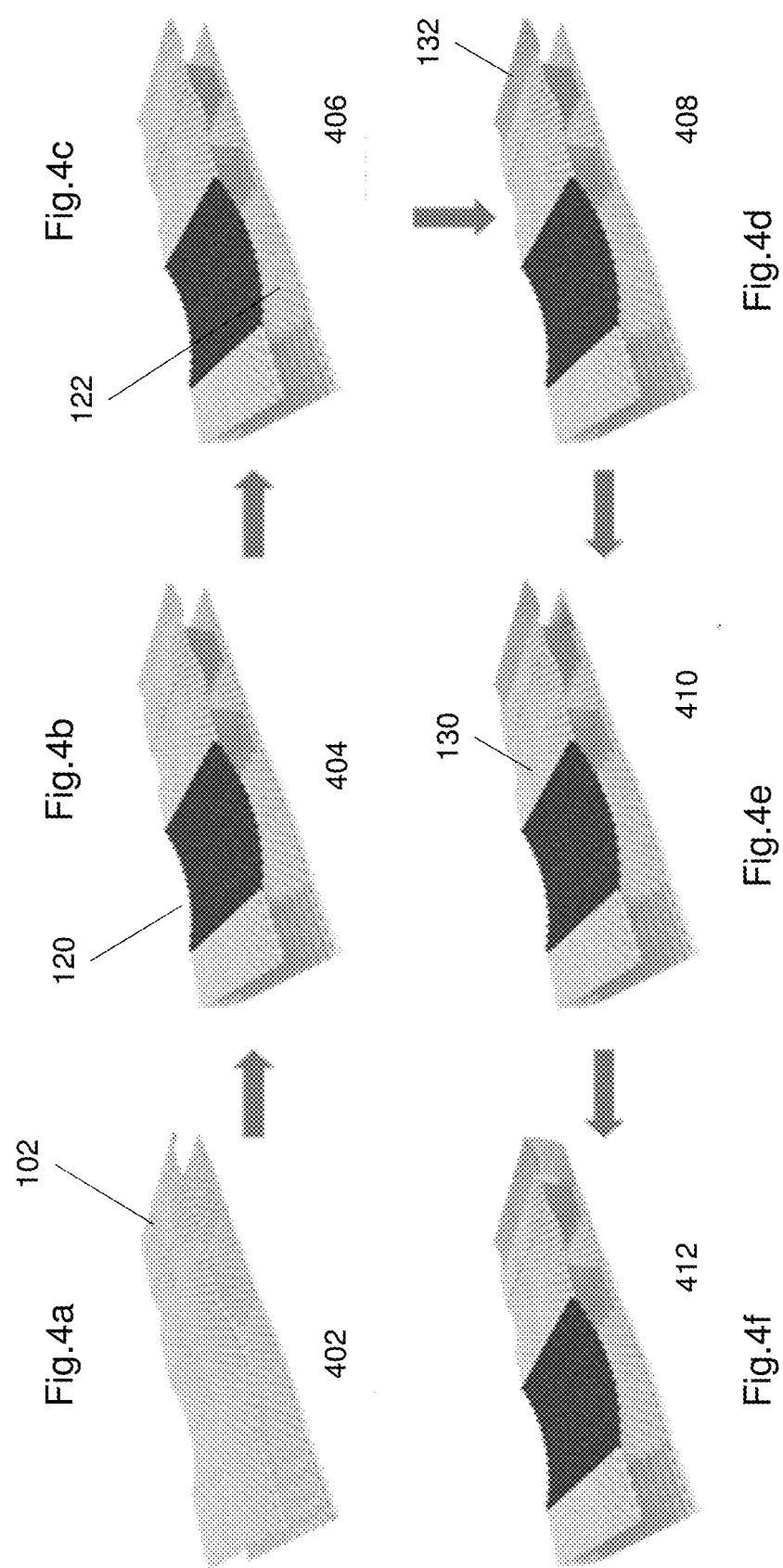

ENERGY HARVESTING AND STORAGE APPARATUS AND A METHOD OF FORMING THEREOF

TECHNICAL FIELD

The present disclosure relates to an energy harvesting and storage system, in particular but not limited to, an integrated energy harvesting and storage system for use in harvesting energy and supplying energy to one or more electrical components or circuits. The present disclosure also relates to method of forming the energy harvesting and energy storage apparatus.

BACKGROUND

Electrical components are commonplace in the modern world, and are used in a wide variety of applications, industries and products. The use of electronics and electronic components is increasing in various applications, products and technologies due to the continued development of electronics technologies and the reduced cost of electronic components.

Flexible electronics are have become commonly place and have a variety of applications in healthcare, military, and other applications. Flexible electronics are used in wearable electronic device components and devices (i.e. wearable electronics). Wearable electronics are used in the creation of smart fabrics. Devices including garments made with smart fabrics can be used in a variety of applications such as healthcare to replace bulky instruments and bulky electronic components.

Powering flexible electronics (e.g. in wearable electronics or smart fabrics) is an essential need for any products incorporating flexible electronics. Individual energy storage devices such as batteries, capacitors, supercapacitors are commonly used to power flexible electronics. However continual powering of flexible electronics using individual energy storage devices becomes problematic once the energy stored within the energy storage devices become fully discharged.

These power storage devices are required to be replaced frequently which can be limiting factor in the use of flexible electronics in various products especially for example smart fabrics or other such products. There is a need for more suitable power sources.

SUMMARY OF THE INVENTION

It is an object of the present invention to provide an integrated energy harvesting and storage system for use in harvesting energy and supplying energy, or for providing the public with a useful alternative.

Other objects of the invention (or inventions) may become apparent from the following description and drawings, which is given by way of example only.

The present disclosure generally relates to an integrated energy harvesting and storage system that is configured to harvest electrical energy from another source of energy and store electrical energy for supply to electronic components.

In accordance with a first aspect the present disclosure relates to an energy harvesting and storage apparatus comprising:
a flexible substrate,
an energy harvesting device disposed on the flexible substrate, the energy harvesting device is configured to convert mechanical energy into electrical energy, an energy storage device disposed on the flexible substrate and in electrical communication with the energy harvesting device and configured to receive and store the electrical energy from the energy harvesting device.

In an embodiment the energy harvesting device being positioned adjacent the energy storage device on the flexible substrate, to form an integrated energy harvesting and storage apparatus.

In an embodiment the energy storage device is a cell comprising an anode, a cathode spaced apart from the anode and an electrolyte positioned between and coupling the anode and cathode to allow charge transfer between the anode and cathode.

In an embodiment the cell comprises a base layer disposed onto the flexible substrate, the anode located on the base layer, the electrolyte located on the anode, the cathode disposed on the electrolyte and an outer layer disposed on the cathode.

In an embodiment the cell is a zinc ion battery comprising a zinc anode, a manganese dioxide cathode.

In an embodiment the anode comprises a zinc sheet, the cathode comprises a paste including manganese dioxide, acetylene black and polyvinylidene flouride, the electrolyte comprises a gelatin based gel comprising at least zinc sulfate and/or manganese sulfate and wherein the base layer and the outer layer comprises a carbon cloth.

In an embodiment the energy harvesting device comprises a nanogenerator that is configured to convert mechanical energy of the flexible substrate into electrical energy.

In an embodiment the nanogenerator comprises a triboelectric nanogenerator.

In an embodiment the energy storage device is coupled to the energy harvesting device in a series arrangement or in a parallel arrangement.

In an embodiment the energy harvesting device comprises a plurality of triboelectric nanogenerators located on the flexible substrate.

In an embodiment the triboelectric nanogenerator comprises a first graphene electrode and a second polytetraflouroethylene (PTFE) electrode.

In an embodiment the triboelectric nanogenerator is configured to convert random mechanical energy from the environment and human motion to electrical energy for storage within the cell.

In an embodiment the flexible substrate is a spacer fabric comprising a first fabric layer and a second fabric layer with a support layer positioned between the first fabric layer and second fabric layer, wherein the support layer maintaining the first fabric layer separated from the second fabric layer.

In an embodiment the first and second fabric layers comprise nylon and the support layer comprises polyester.

In an embodiment energy harvesting and energy storage apparatus being configured to provide electrical energy to an electrical circuit that is connected to the energy harvesting and energy storage apparatus.

In an embodiment energy harvesting device is formed on a separate portion of the substrate to the energy storage device according to any one of the above embodiments.

In accordance with another aspect, the present disclosure relates to a garment comprising the energy harvesting and energy storage apparatus as per any one of the above statements.

In an embodiment the garment is a wearable garment.

In an embodiment the garment comprises a portion of spacer fabric, wherein a region of the spacer fabric forms the flexible substrate of the energy harvesting and energy storage apparatus.

In accordance with a further aspect, the present disclosure relates to a wearable power supply unit for use with an electronic circuit comprising the energy harvesting and energy storage apparatus according to any one or more of the above embodiments.

In an embodiment the wearable power supply is positioned on a wearable garment.

In an embodiment the energy harvesting device and the energy storage device are formed on the flexible substrate by electrodeposition.

In accordance with a further aspect, the present disclosure relates to a method of forming an energy harvesting and an energy storage apparatus comprising:

providing a flexible substrate, constructing an energy harvesting device by coating a portion of the flexible substrate with a first ink and a second ink, constructing an energy storage device by electrodepositing an anode, depositing a cathode and providing an electrolyte between the anode and cathode.

In an embodiment the energy harvesting device is a triboelectric nanogenerator and the energy storage device is a cell.

In an embodiment the triboelectric nanogenerator comprising the first ink and second ink, wherein the first ink comprises graphene ink and the second ink comprises a polytetraflouroethylene (PTFE) ink.

In an embodiment the cell is assembled by the steps of: positioning a flexible conductive carbon cloth, electrodepositing zinc plate onto the carbon cloth to form the anode, depositing a manganese dioxide paste onto the carbon cloth to form the cathode, and injecting a gelatin based gel electrolyte between the anode and the cathode.

In an embodiment the cathode further comprises acetylene black and polyvinylidene fluoride mixed with manganese dioxide to form a paste.

In an embodiment the cathode comprises a paste of manganese dioxide, acetylene black and polyvinylidene fluoride in a ratio of 7:2:1.

In an embodiment the flexible substrate comprises a space fabric, wherein the spacer fabric comprises a first fabric layer and a second fabric layer with a support layer positioned between the first fabric layer and second fabric layer, wherein the support layer maintaining the first fabric layer separated from the second fabric layer.

In an embodiment the first and second fabric layers comprise nylon and the support layer comprises polyester.

In an embodiment the carbon cloth is sewn onto the spacer fabric.

In an embodiment the spacer fabric is formed by knitting the first fabric layer and a second fabric layer, and the support layer is then knitted between the first and second fabric layer.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

As used herein the term 'and/or' means 'and' or 'or', or where the context allows both.

The invention consists in the foregoing and also envisages constructions of which the following gives examples only. In the following description like numbers denote like features.

As used herein "(s)" following a noun means the plural and/or singular forms of the noun.

In the following description, specific details are given to provide a thorough understanding of the embodiments. However, it will be understood by one of ordinary skill in the art that the embodiments may be practiced without these specific details. For example, software modules, functions, circuits, etc., may be shown in block diagrams in order not to obscure the embodiments in unnecessary detail. In other instances, well-known modules, structures and techniques may not be shown in detail in order not to obscure the embodiments.

Also, it is noted that at least some embodiments may be described as a method (i.e. process) that is depicted as a flowchart, a flow diagram, a structure diagram, or a block diagram. Although a flowchart may describe the operations as a sequential method, many of the operations can be performed in parallel or concurrently. In addition, the order of the operations may be rearranged. A method (i.e. process) is terminated when its operations are completed.

In this specification, the word "comprising" and its variations, such as "comprises", has its usual meaning in accordance with International patent practice. That is, the word does not preclude additional or unrecited elements, substances or method steps, in addition to those specifically recited. Thus, the described apparatus, substance or method may have other elements, substances or steps in various embodiments. The term "comprising" (and its grammatical variations) as used herein are used in the inclusive sense of "having" or "including" and not in the sense of "consisting only of".

BRIEF DESCRIPTION OF THE DRAWINGS

Notwithstanding any other forms which may fall within the scope of the present disclosure, a preferred embodiment will now be described, by way of example only, with reference to the accompanying drawings in which:

FIG. 4 shows a flow chart of a further embodiment of a method for forming an energy harvesting and energy storage apparatus.

FIGS. 4*a* to 4*f* visually illustrates the method of forming the energy harvesting and energy storage apparatus as per FIG. 4.

DETAILED DESCRIPTION OF AN EXEMPLARY EMBODIMENT

Flexible electronics are have become commonly place and have a variety of applications in healthcare, military, and other applications. Flexible electronics are used in wearable electronic device components and devices (i.e. wearable electronics). Wearable electronics are used in the creation of smart fabrics. Devices including garments made with smart fabrics can be used in a variety of applications such as healthcare to replace bulky instruments and bulky electronic components.

Powering electronics has always been a challenge. In particular with the increasing popularity and usage of flexible electronics, especially wearable electronics, mobile power sources are a need. Currently used energy harvesting devices and energy storage devices have some intrinsic problems. For example the differences in the physical or chemical mechanisms of the energy storage and harvesting processes make the two distinctive and separate. Some example problems is the frequent and sometimes inconvenient charging is one of the bottleneck of the rechargeable batteries, lack of integration of a device and the size of currently available devices.

The present disclosure relates to an energy harvesting and energy storage apparatus that can be used for powering various electronic devices or circuits that are coupled to the energy harvesting and energy storage apparatus. The energy harvesting and energy storage apparatus is an integrated apparatus. The energy harvesting and energy storage apparatus formed on a flexible substrate, wherein the flexible substrate may be a fabric.

The present disclosure also relates to a garment that comprises the integrated energy harvesting and energy storage apparatus. The garment may be a wearable garment such as for example a shirt, a t-shirt, a sweater, a sweatshirt, trousers, shorts, singlet or any other suitable wearable garment. The integrated energy harvesting and energy storage apparatus being positioned on a wearable garment allows the energy harvesting and energy storage apparatus to be used with wearable electronics devices. The energy harvesting and energy storage apparatus may be used as a wearable power supply unit for use with an electronic circuit. The wearable power supply may be incorporated with a wearable garment e.g. by sewing or knitting or by another suitable manner.

An integrated energy storage and energy harvesting becomes one feasible approach to provide continual power supply for flexible and wearable electronics. The disclosed integrated energy harvesting and energy storage apparatus provides one approach for providing power to wearable electronic devices or wearable electronics.

Figure 1:
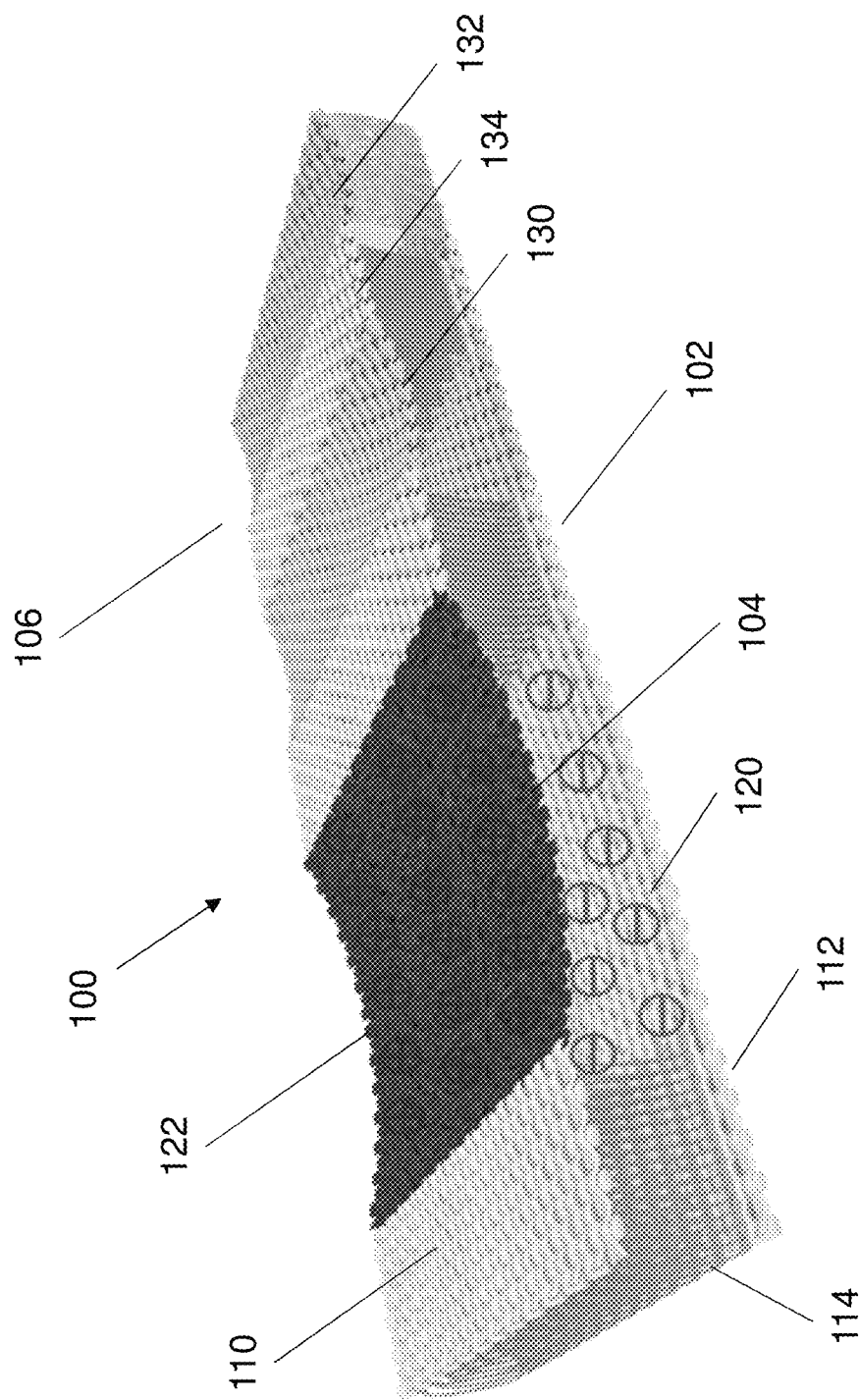
FIG. 1 is a diagram of an exemplary energy harvesting and energy storage apparatus.

FIG. 1 shows an exemplary embodiment of an energy harvesting and energy storage apparatus 100.

Figure 2:
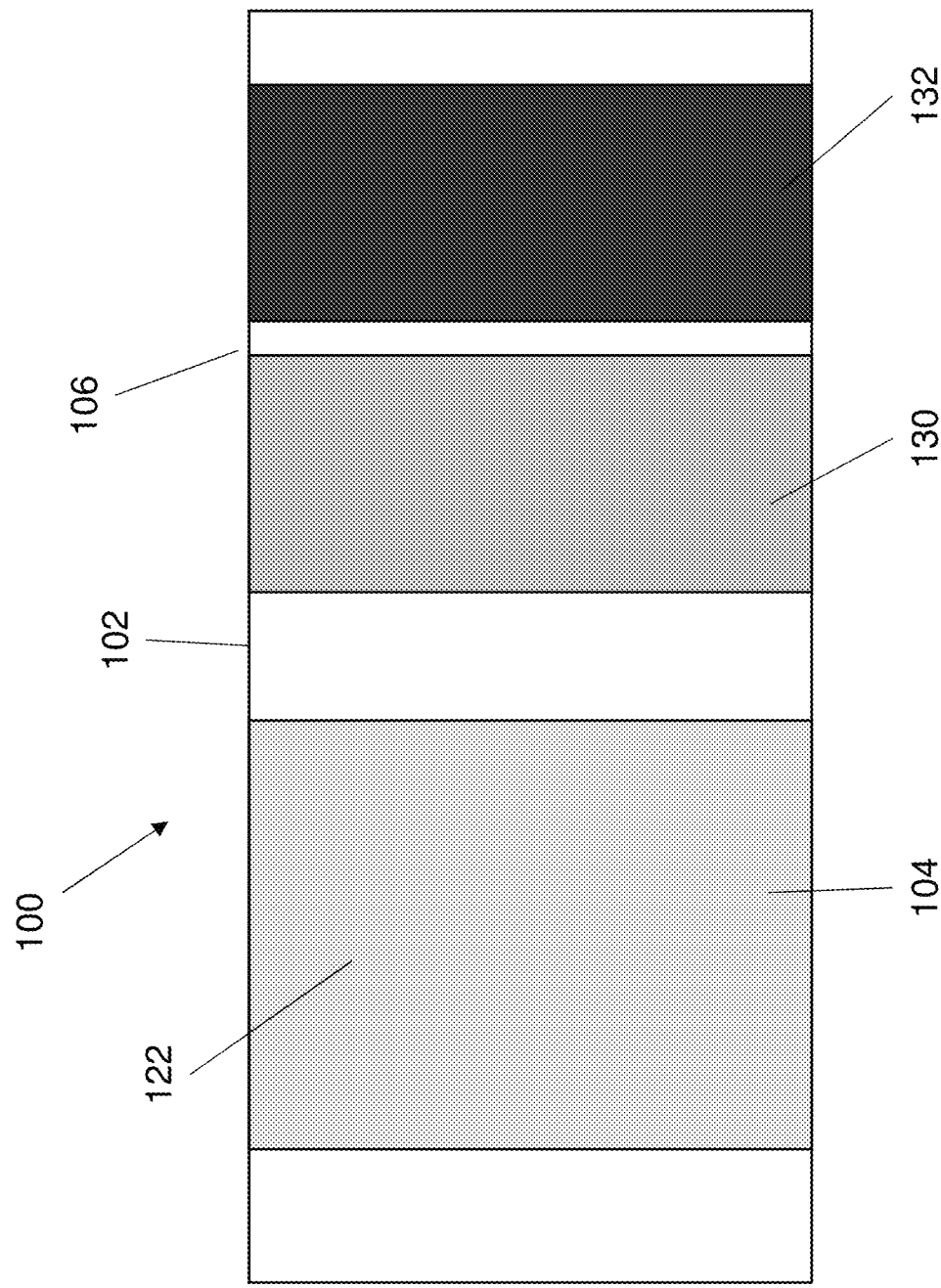
FIG. 2 shows a schematic diagram of the energy harvesting and energy storage apparatus of FIG. 1.

FIG. 2 shows a schematic diagram of the energy harvesting and energy storage apparatus 100. The energy harvesting and energy storage apparatus 100 will be described in more detail with reference to FIGS. 1 and 2.

The energy harvesting and energy storage apparatus 100 comprises a substrate 102, an energy harvesting device 104 disposed on the substrate 102 and an energy storage device 106 also disposed on the substrate 102. FIG. 2 shows a schematic diagram of the apparatus 100.

The energy harvesting device 104 is configured to convert the mechanical energy into electrical energy. The energy storage device 106 is arranged in electrical communication with the energy harvesting device and configured to receive and store the electrical energy from the energy harvesting device 104. The stored electrical energy can be supplied to an electrical circuit or another electrical device coupled to the energy storage device 106.

The substrate 102 is preferably a flexible substrate that can move and flex in response to various loading. In the illustrated embodiment the flexible substrate 102 comprises fabric. At least a portion of the flexible substrate is formed of a fabric. As shown in the illustrated embodiment of FIG. 1, the flexible substrate 102 comprises a spacer fabric. More specifically the flexible substrate 102 is a 3D spacer fabric (referred to herein as spacer fabric). The energy harvesting device 104 and the energy storage device 106 are disposed on the spacer fabric 102. 3D spacer fabrics are advantageous because they breathable, cushioned and multi-faceted. The spacer fabric provides a suitable, flexible, cushioned and breathable substrate to carry the energy harvesting device 104 and the energy storage device 106. Spacer fabric can also be incorporated into other fabrics or other wearable items e.g. garments and provides a substrate that can be used to provide a wearable energy source.

The spacer fabric substrate 102 comprises first fabric layer 110 and a second fabric layer 112 with a support layer 114 positioned between the first fabric layer 110 and the second fabric layer 112. The support layer 114 maintains a distance between the first fabric layer 110 and the second fabric layer 112. The first fabric layer 110 may be the layer that is exposed to air while the second fabric layer 112 may not be exposed to air. Each fabric layer 110, 112 may be designed for specific function. For example the first fabric layer may be breathable and permeable to moisture. In another example at least one or both fabric layers 110, 112, may be suitably designed for incorporation into other products such as for example knitted into garments. The support layer 114 provides cushioning and may be configured to transport moisture from the second fabric layer to the first fabric layer. The support layer 114 may also be configured to transport heat and allow air flow to be transported from the second fabric layer 112 to the first fabric layer 110.

The energy harvesting device 104 is disposed on the flexible substrate 102 and is configured to convert mechanical energy to electrical energy. In particular the energy harvesting device 104 is configured to convert motion (i.e. kinetic energy) of the flexible substrate 102 into electrical energy. The energy harvesting device 104 is further configured to harvest random mechanical energy from the environment and human motion (e.g. when the apparatus 100 and substrate is worn by the user) to electrical energy. The electrical energy to transferred to the energy storage device 106, thus allowing the apparatus 100 to be used as a power supply.

The energy harvesting device 104 is preferably a nanogenerator. The nanogenerator converts mechanical energy e.g. kinetic energy due to motion of the substrate due to environmental affects or human motion or other stimulus, to electrical energy for storage by device 106. In the illustrated embodiment of FIG. 1 the nanogenerator is a triboelectric nanogenerator (TENG). In the illustrated configuration the apparatus 100 comprises a single triboelectric nanogenerator (TENG). The triboelectric nanogenerator (TENG) operates based on the triboelectric effect and electrostatic induction.

The triboelectric nanogenerator (TENG) 104 comprises at least a first electrode 120 and a second electrode 122. In the illustrated embodiment the TENG 104 comprises a first graphene electrode 120 and a second polytetraflouroethylene (PTFE) i.e. Teflon electrode 122. Each electrode may be formed by coating the substrate with a graphene ink and a PTFE ink. These inks are deposited on the fabric substrate 102. The electrodes 120, 122 may be arranged in any suitable configuration and operate in any suitable mode e.g. a lateral sliding mode, vertical contact separation mode or a single electrode mode. The TENG converts mechanical energy exposed to the substrate, to electrical energy, which is transferred to the electrical storage device 106. As shown in FIG. 1 the TENG device 104 creates charge movement between the electrodes. FIG. 1 shows positive charge accumulating on the negative electrode and the negative charges accumulating on the positive electrode. The movement of charges releases electrons and electric energy (i.e. electricity).

The TENG device is advantageous because it provides a good electrical output. The TENG device 104 as shown in FIG. 1 generates an average open circuit voltage of 15V and a short circuit current of about 4 micro amps. The TENG device 104 (i.e. energy harvesting device 104) is structured to also produce a maximum power output of 43.65 micro Watts, corresponding to a power density of 18.19 mW m$^{-2}$.

The electrical storage device 106 may be any device capable of receiving and storing electrical energy. In the illustrated embodiment the electrical storage device 106 is a cell. The cell 106 comprises an anode 130, a cathode 132 spaced apart from the anode, and an electrolyte 134 positioned between the anode 130 and the cathode 132. The electrolyte 134 electrically couples the anode 130 and cathode 132 to allow charge transfer between the anode 130 and the cathode 132. The cell 106 is a zinc ion battery. The anode 130 comprises a zinc sheet and the cathode comprises manganese dioxide, specifically a paste comprising at least manganese dioxide.

In the illustrated embodiment the cell 106 further comprises a base layer disposed onto the flexible substrate. The base layer is preferably a carbon cloth that is attached to the substrate. The carbon cloth may comprise carbon nano rods or a sheet of carbon. The carbon cloth may be attached to the substrate 102 in any suitable process e.g. by electrodeposition or gluing or any other suitable process.

The anode 130 is located on the base layer, the electrolyte is located on the anode, the cathode 132 is disposed on the electrolyte and an outer layer is disposed on the cathode 132.

The anode 130 comprises a zinc sheet that is disposed onto the base layer. The anode 130 the zinc sheet is electrodeposited onto the carbon cloth of the base layer. Alternatively the anode 130 may comprise a plurality of zinc rods. The cathode 132 comprises a paste including manganese dioxide, conductive acetylene black and polyvinylidene fluoride (PVDF). Alternatively the cathode may comprise manganese dioxide nanorods that are suspended in the paste. The weight ratio of manganese dioxide, acetylene black and PVDF is 7:2:1 to form the cathode paste. The cathode paste is blade coated onto the carbon cloth (i.e. base layer). Alternatively the cathode paste may be disposed either on the electrolyte or anode. The outer layer may also be a carbon cloth, and the cathode paste may be disposed on the outer layer.

The electrolyte 134 comprises a gelatin based gel electrolyte. The gelatin based gel contains 1.0M of zinc sulfate and 0.1M of manganese sulfate. The electrolyte 134 is preferably injected between the anode 130 and the cathode 132. The electrolyte 134 is preferably a solution of zinc sulfate and manganese sulfate.

The cell 106, as shown in FIG. 1, is designed to have a maximum discharge capacity of about 290 mAhg$^{-1}$ and a maximum discharge capacity of 264 mAhg$^{-1}$ at 1 C charge density in aqueous electrolyte and gelatin based gel electrolyte respectively.

The zinc ion cell 106 can be charged and discharged. The zinc ion 106 cell is charged when it receives electrical energy from the TENG 104. The zinc ion cell 106 is discharged to a connected electrical component, device or circuit. The cell 106 is designed to be cycled (i.e. charged and discharged) at least a 1000 times with minimal losses or degradation in performance. The cell 106 is structured such that it can be cycled (i.e. charged and discharged) for at least 1000 times with approximately 77% capacity retention at 4 C using the gelatin based gel electrolyte. The cell 106 is constructed to be charged from 0.93V to 1.28V within 30 mins and deliver a discharge capacity of between 10 and 11 µAh (preferably 10.8 µAh) at 4 micro amps current.

Figure 2A:
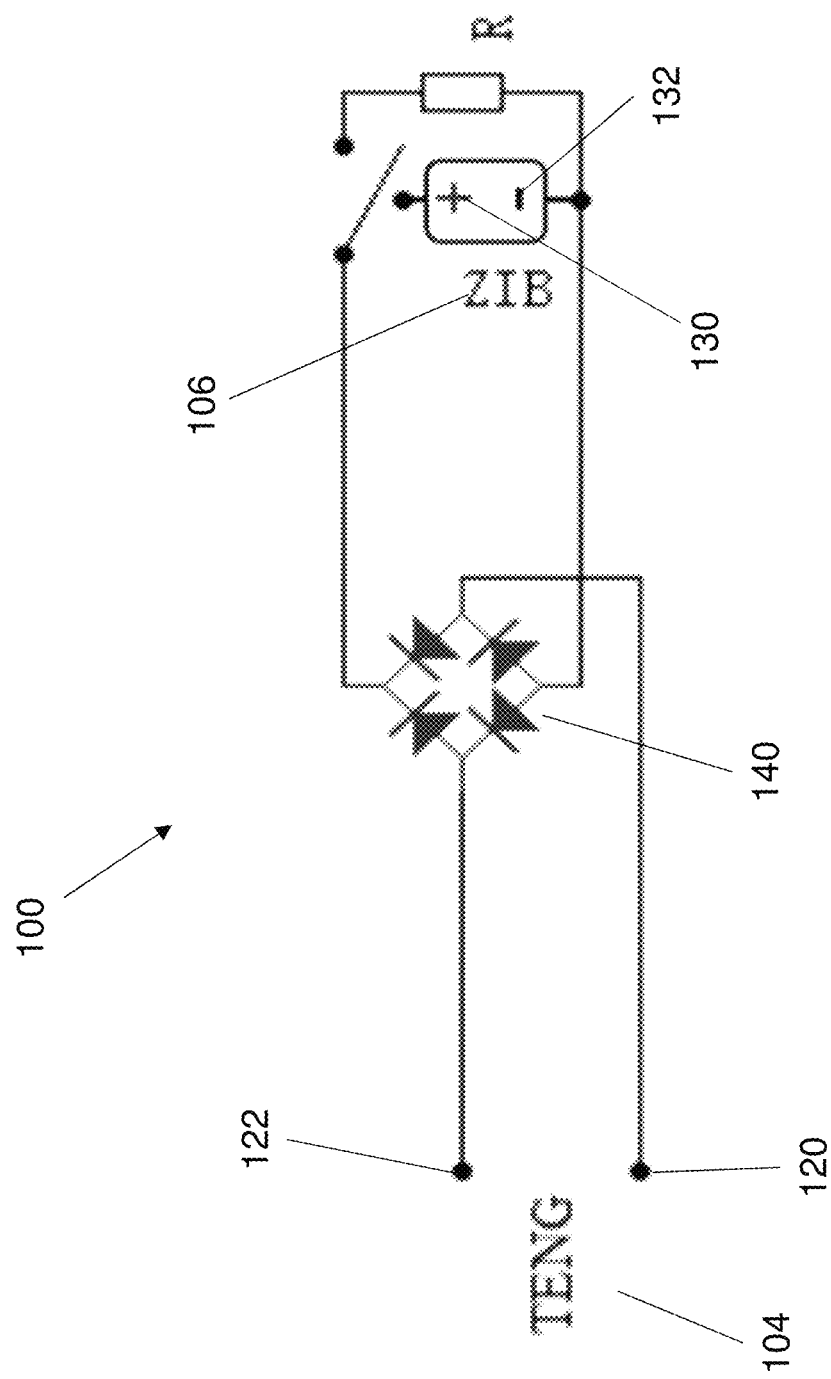
FIG. 2*a* shows an electrical circuit diagram of the energy harvesting and energy storage apparatus of FIGS. 1 and 2.

FIG. 2a shows an electrical circuit diagram of the integrated energy harvesting and energy apparatus 100. The energy harvesting device 104 (i.e. TENG device) comprises at least a pair of electrodes 110, 112. The TENG device 104 is coupled to a rectifier arrangement 140. The rectifier arrangement 140 may be part of the TENG device 104 or alternatively may be a separate component electrically coupled to the TENG device 104. The rectifier arrangement 140 as shown in FIG. 2 is a full bridge rectifier comprising four diodes arranged in a rectifier circuit. The energy storage device 106 (i.e. zinc ion cell 106) is connected in parallel with the rectifier circuit. The electrical energy harvested by the TENG device 104 is rectified by the rectifier 140 i.e. any AC components from the TENG device 104 are converted to a DC voltage. The DC voltage is used to charge the cell 106. The cell 106 is coupled to a load R. The load R may be any load e.g. a wearable electronic device or electrical circuit or any other device that may be powered by the apparatus 100.

Figure 3:
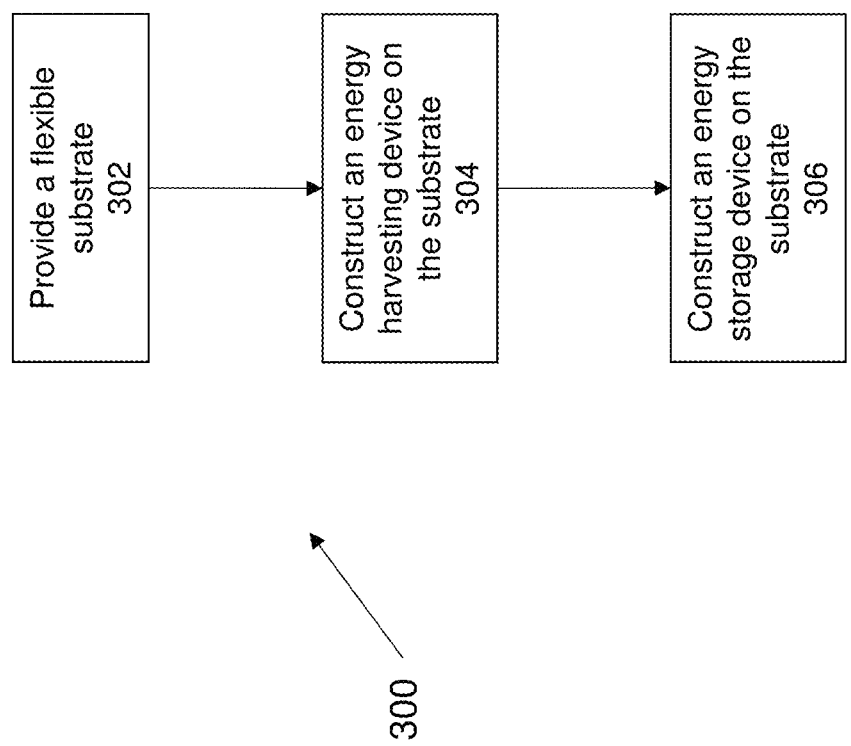
FIG. 3 shows a flow chart for an embodiment of a method of forming the energy harvesting and energy storage apparatus.

FIG. 3 shows a flow chart for a method of forming the energy harvesting and energy storage apparatus 300. The method 300 begins at step 302. Step 302 comprises providing a flexible substrate. The flexible substrate is a spacer fabric. Step 304 comprises constructing an energy harvesting device on the flexible substrate. The energy harvesting device is constructed by coating a portion of the flexible substrate with a first ink and a second ink. Step 306 comprises constructing an energy storage device. The energy storage device is constructed by electrodepositing an anode, depositing a cathode and providing an electrolyte between the anode and the cathode.

The energy harvesting device is a triboelectric nanogenerator and the energy storage device is a cell. The energy harvesting device and cell are constructed by depositing various components of thereof on the flexible substrate.

FIG. 4 illustrates a flow chart of an exemplary method 400 for forming an energy harvesting and energy storage apparatus. The method commences at step 402 that comprises providing a 3D spacer fabric portion that functions as the substrate to carry the energy harvesting device and the energy storage device. Step 404 comprises applying a graphene ink to the 3D spacer fabric to form a first electrode. Step 406 comprises applying a PTFE ink onto the 3D spacer fabric to form a second electrode. Steps 404 and 406 together define creation of a triboelectric nanogenerator (TENG device) 104, comprising a pair of electrodes onto the 3D spacer fabric substrate. The graphene ink functions as a first electrode and the PTFE ink acts as a second electrode.

Method 400 progresses to step 408 that comprises forming a cathode comprising manganese dioxide onto a carbon cloth that is coupled to the substrate. Step 410 comprises forming an anode comprising zinc onto a carbon cloth. Step 412 comprises injecting a gel electrolyte between the anode and the cathode.

Steps 408 to 412 define formation of the cell 106 (in this example a zinc ion cell) onto the substrate.

The TENG device 104 and the zinc ion cell 106 are located adjacent each other on the substrate and occupy different areas. The TENG device 104 may be formed in a substantially rectangular shape having a length of 40 mm to 80 mm and a width between 20 mm to 60 mm. In the illustrated embodiment of FIG. 1 and FIGS. 4a to 4b comprises a length of 60 mm and a width of 40 mm. The cell 106 may also comprises a substantially rectangular shape. The cell 106 may have a length between 40 mm and 80 mm and a width of between 10 mm and 40 mm. In the illustrated embodiment the cell 106 comprises a length of 60 mm and a width of 25 mm.

FIGS. 4a to 4f visually illustrates the method 400 of forming the energy harvesting and energy storage apparatus. Additional detail associated with each method step is also disclosed with reference to FIGS. 4a to 4f.

FIG. 4a illustrates step 402 that comprises providing the spacer fabric. The spacer fabric is preferably a 3D spacer fabric. The 3D spacer fabric can be formed by knitting the three layers (first fabric layer, second fabric layer and the spacer layer) together. The three layers may be knitted together by using a machine such as for example a STOLL flat knitting machine. Preferably the first and second layers are knitted first using the front and back needle using different sets of nylon yarn respectively. The support spacer layer was then knitted with defined sequence on both the front and back needle bed using a polyester yarn. The spacer fabric support layer in the illustrated embodiment has a thickness between 5 mm and 10 mm, but preferably between 7 mm and 8 mm, and more preferably approximately 7.5 mm.

The fabric is made of nylon which provides the substrate with flexibility. The fabric layer may have an increased tensile extensibility than the spacer layer (i.e. the fabric layers are more stretchy than the spacer layer). The substrate is substantially elastic in most at least an axial direction. The substrate may be constructed out a suitable fabrics to provide a desired extensibility. The 3D spacer fabric is mechanically elastic and can stretch, compress, twist without any plastic deformation.

In some configurations the 3D spacer fabric (i.e. substrate) 102 may comprise multiple alternating fabric and spacer layers. For example the 3D spacer fabric 102 may comprise two outer fabric layers and two or more spacer layers with a fabric layer between two adjacent spacer layers. The fabric layers may be formed of knitted nylon and the spacer layer may be formed of a knitted polyester.

The dimensions and two dimensional shape of the substrate section used to carry the energy harvesting and energy storage apparatus can be dimensioned to suit the needs and applications. For example the substrate may be square or rectangular or ellipse or circular or any polygon shape. The substrate may have a length between 50 mm to 200 mm and a width between 50 to 200 mm. In the illustrated configuration shown in FIG. 1, the total substrate is substantially rectangular in shape, having a length of 120 mm and a width of 65 mm.

The energy harvesting device (i.e. TENG device) 104 is formed by electrodeposition, as shown in FIGS. 4b and 4c. FIGS. 4b and 4c show steps 404 and 406 of the method of forming the flexible substrate. FIG. 4b illustrates the step 404 of coating the 3D spacer fabric with graphene ink. The graphene ink forms a first electrode 120 of the TENG device 104. FIG. 4c shows step 406 that comprises coating the 3D spacer fabric with a PTFE ink. The PTFE ink defines the second electrode 122 of the TENG device 104. The 3D spacer fabric 102 is dried in an oven following the application of the ink to create the TENG device 104. As shown in FIG. 1 and FIGS. 4b and 4c, the first and second electrodes 120, 122 of the TENG device 104 are formed on opposing fabric layers.

The method may comprise the optional steps of rinsing the formed spacer fabric with mixture of acetone and alcohol, as well as deionized water. The spacer fabric may also be exposed to ultrasonic vibrations during the washing process to remove surface contaminants. Optionally a conductive tape may be applied over the graphene ink and the PTFE ink.

FIGS. 4d to 4f illustrate forming of the energy storage device 106 (i.e. a cell) onto the spacer fabric. As described earlier the cell comprises at least an anode, a cathode and an electrolyte positioned between the anode and cathode to couple the anode 130 and cathode 132. FIG. 4d illustrates step 408. As shown in FIG. 3d the cathode 132 is initially formed on the 3D spacer fabric. The step shown at FIG. 4d first includes attaching a flexible, conductive carbon cloth to the 3D spacer fabric. The carbon cloth forms a base layer and functions as a current collector.

The cathode 132 comprises depositing a manganese dioxide paste onto the carbon cloth to form the cathode 132. The cathode paste comprises mixing manganese dioxide with conductive acetylene black and polyvinylidene fluoride (PVDF) at a weight ratio of 7:2:1. The manganese dioxide may comprise a plurality of manganese dioxide nanorods that may be synthesized e.g. using a hydrothermal method. The average amount of cathode paste that is coated onto the carbon cloth is between 1 to 5 $mg\ cm^{-2}$ and more preferably between 1 to 2 $mg\ cm^{-2}$.

FIG. 4e illustrates the step 410 that comprises depositing the anode 130 onto the flexible substrate. The anode 130 comprises a zinc sheet. The zinc sheet may be formed by electrodeposition onto a carbon cloth. The carbon cloth preferably functions as a current collector. The carbon cloth supporting the anode may form an upper layer of the battery.

As shown in FIG. 4e the anode 130 and cathode 132 are formed adjacent each other on the spacer fabric. The carbon cloth upper layer and carbon cloth base layer may extend across the anode 130 and cathode 132 to encase the anode 130 and the cathode 132. At least the upper carbon cloth may also function as a counter electrode and a reference electrode. Wires may be coupled directly to upper carbon cloth or both the upper and base layer carbon cloths in order to transmit electricity from the cell 106 to the coupled electrical circuit. The two carbon cloths are also sewn into the 3D spacer fabric substrate 102 to anchor the cell 106 onto the spacer fabric.

FIG. 4f illustrates step 412 that comprises injecting a gel electrolyte to couple the anode and the cathode. The electrolyte is preferably injected into the middle of the anode and the cathode or at least between the two carbon cloths. The electrolyte is preferably a gelatin based gel electrolyte. The anode 130 and cathode 132 may alternatively be formed on opposing fabric layers of the substrate 102.

The zinc sheet forming the anode 130 may comprise a layer of planar shaped zinc nanorods with a length of between 5 micro meters to 10 micro meters, preferably the length being between 9 micro meters and 11 micro meters. The width of the zinc nanorods may be between 0.5 micro meters and 3 micro meters, preferably between 1 micro meter and 2 micro meters and a thickness of less than 1 micro meter. The manganese dioxide nanorods comprise a length of between 5 and 25 microns and have a diameter of 50 nano meters. The nylon fibers become rougher after being coated by the layer of graphene ink or PTFE ink. In the TENG device 104, the graphene ink functions as the positive electrode and the PTFE ink functions as the negative electrode.

Figure 5A:
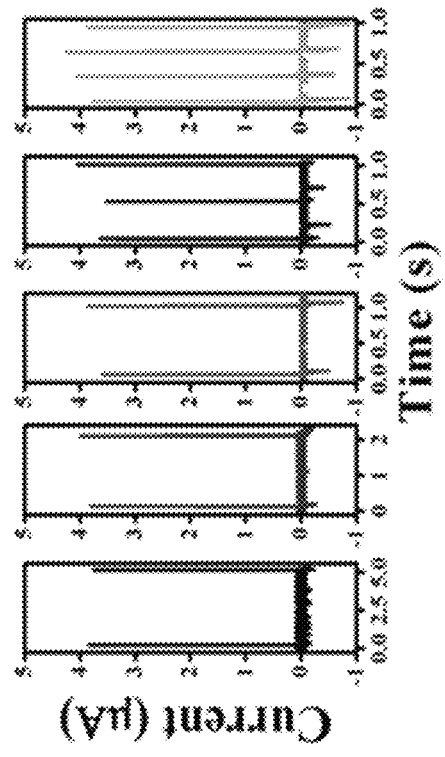
FIG. 5*a* is a plot of the voltage of the energy harvesting device at different frequencies ranging from 0.2 Hz to 4 Hz.
Figure 5B:
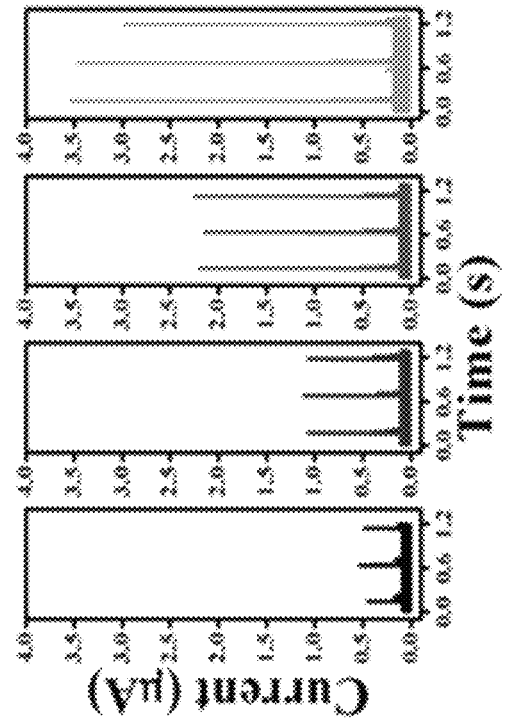
FIG. 5b shows a plot of the current of the energy harvesting device at different frequencies ranging from 0.2 Hz to 4 Hz.

FIGS. 5a and 5b illustrate plots the voltage ($V_{oc}$) and current ($I_{sc}$) of the TENG device 104 at different frequencies ranging from 0.2 Hz to 4 Hz, without rectification. The TENG device 104 generally outputs voltage within the range of 10 to 15 Volts and a current of between 3 to 4 micro Amps. This voltage and current is sufficient to light an LED. The mechanical elasticity and extensibility of the flexible substrate 102 (i.e. the 3D spacer fabric) provides the TENG device with good recoverability against consecutive contact-separation motion i.e. the TENG device can recover and does not break in response to axial motion i.e. contact-separation motion due to the extensibility and elasticity of the 3D spacer fabric. The frequency of the Voltage and Current (i.e. ($V_{oc}$) and ($I_{sc}$)) generated by the TENG device 104 corresponds to the frequency of mechanical input exerted onto the spacer fabric 102. The TENG device converts the mechanical energy exerted on the spacer fabric 102 to electrical energy, as shown in FIGS. 5a, 5b.

Figure 5C:
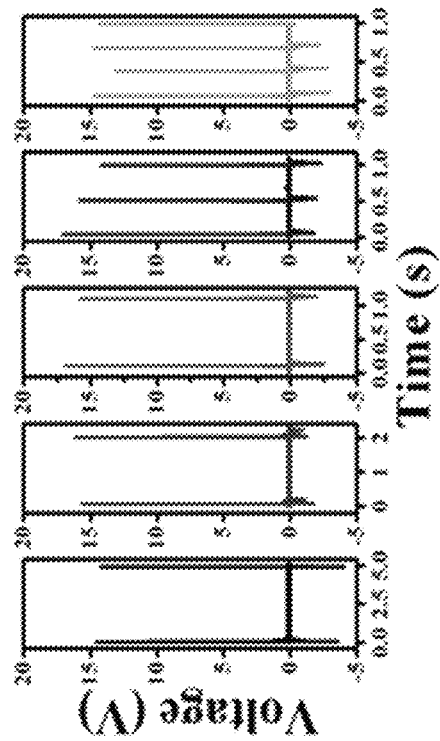
FIGS. 5c and 5d show the output of the voltage and the current when connected to the rectifier.
Figure 5D:
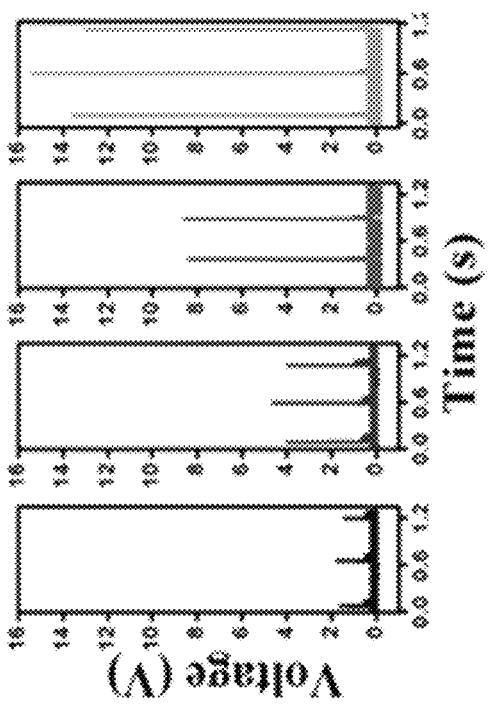

FIGS. 5c and 5d show the output of the voltage ($V_{oc}$) and the current ($I_{sc}$) when connected to the rectifier. As shown in FIGS. 5c and 5d the negative half signals are converted into positive signals by the rectifier.

Figure 5F:
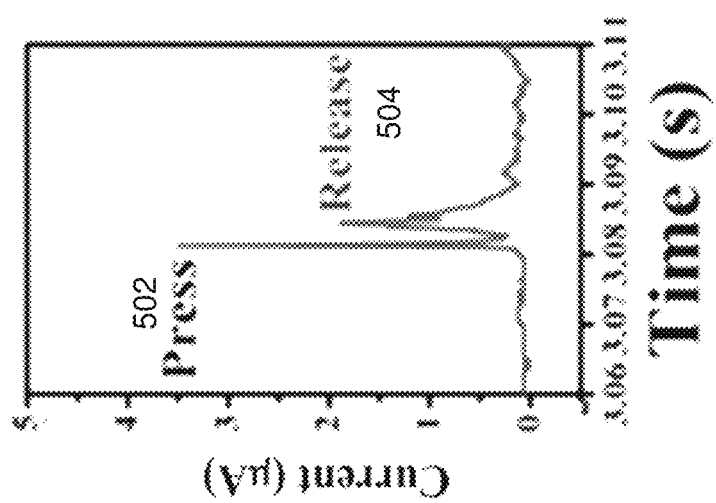
FIGS. 5e and 5f illustrate the magnitude of voltage and current signals respectively, as generated due to pressure exerted onto the TENG device.
Figure 5E:
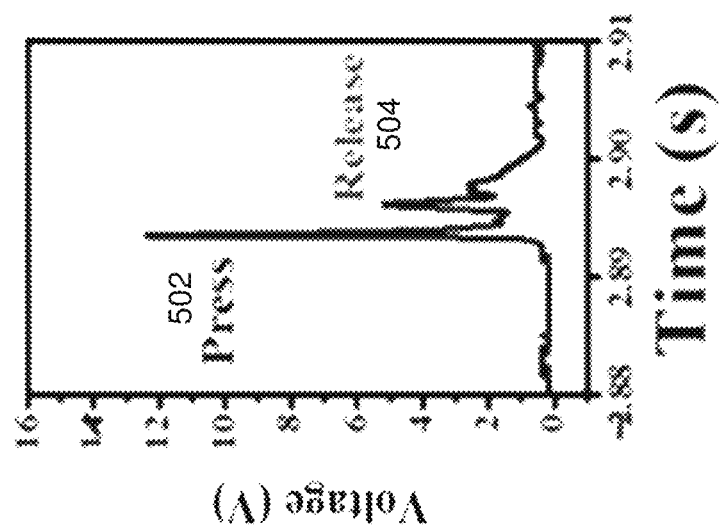

FIGS. 5e and 5f shows the magnitude of the voltage and current as they correlate to the value of the pressure exerted onto the TENG device 104, in which the values of ($V_{oc}$) and ($I_{sc}$). The value of the voltage and current generated by the TENG device 104 increases with increasing pressure, since pressure applied is a mechanical energy. FIGS. 5e and 5f show the peaks 502 and 504 corresponding to pressure and respective peaks when the pressure is released. The peaks in ($V_{oc}$) and ($I_{sc}$) when the pressure is released due to the transient movement of the spacer fabric 102 that is harvested by the TENG device 104 and converted to electrical energy. FIGS. 5e and 5f illustrate how the TENG device can be used convert mechanical motion i.e. kinetic energy to electrical energy. The TENG device 104 converts motion of the substrate to electrical energy.

Figure 6A:
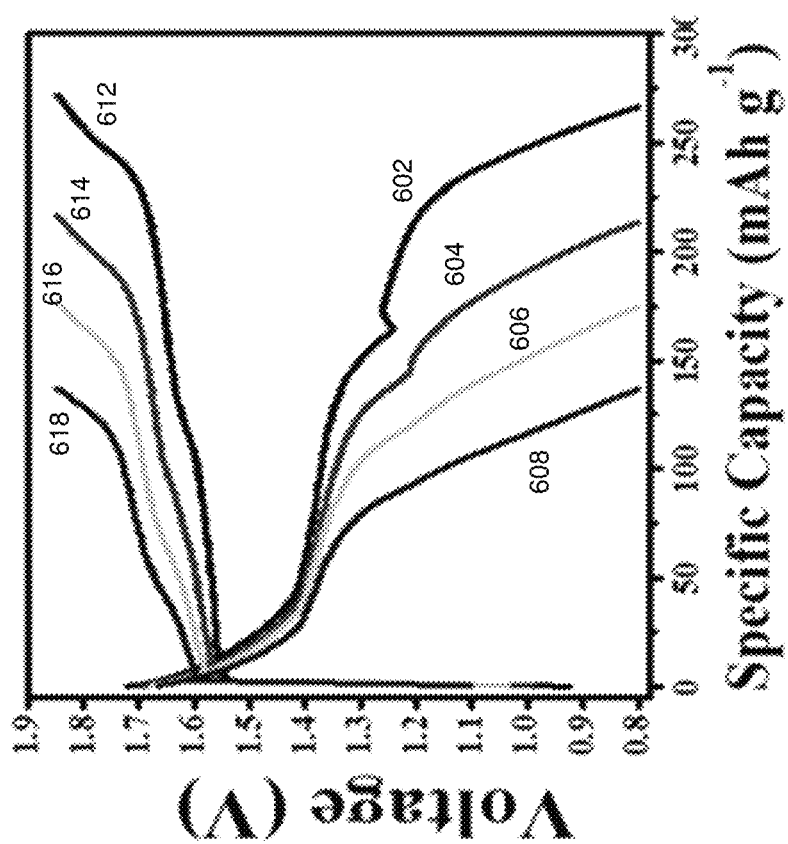
FIG. 6a shows charge and discharge curves of the zinc ion cell at different current densities ranging from 1 C to 4 C.

FIG. 6a shows charge and discharge curves of the zinc ion cell 106 at different current densities ranging from 1 C to 4 C. These charge and discharge curves correspond to the gelatin based gel electrolyte. Discharge curve 602 corresponds to 1 C, discharge curve 604 corresponds to 2 C, discharge curve 606 corresponds to 3 C and discharge curve 608 corresponds to 4 C. Recharge curve 612 corresponds to 1 C, recharge curve 614 corresponds to 2 C, recharge curve 616 corresponds to 3 C and recharge curve 618 corresponds to 4 C. The curves plateau at around 1.3-1.4V at 1 C thereby delivering a maximum capacity of 265 $mAhg^{-1}$ in the gel electrolyte. Upon increasing the current densities to 2, 3 and 4 C, the discharge capacity can be retained to be 214, 175 and 136 $mAhg^{-1}$ respectively.

Figure 6B:
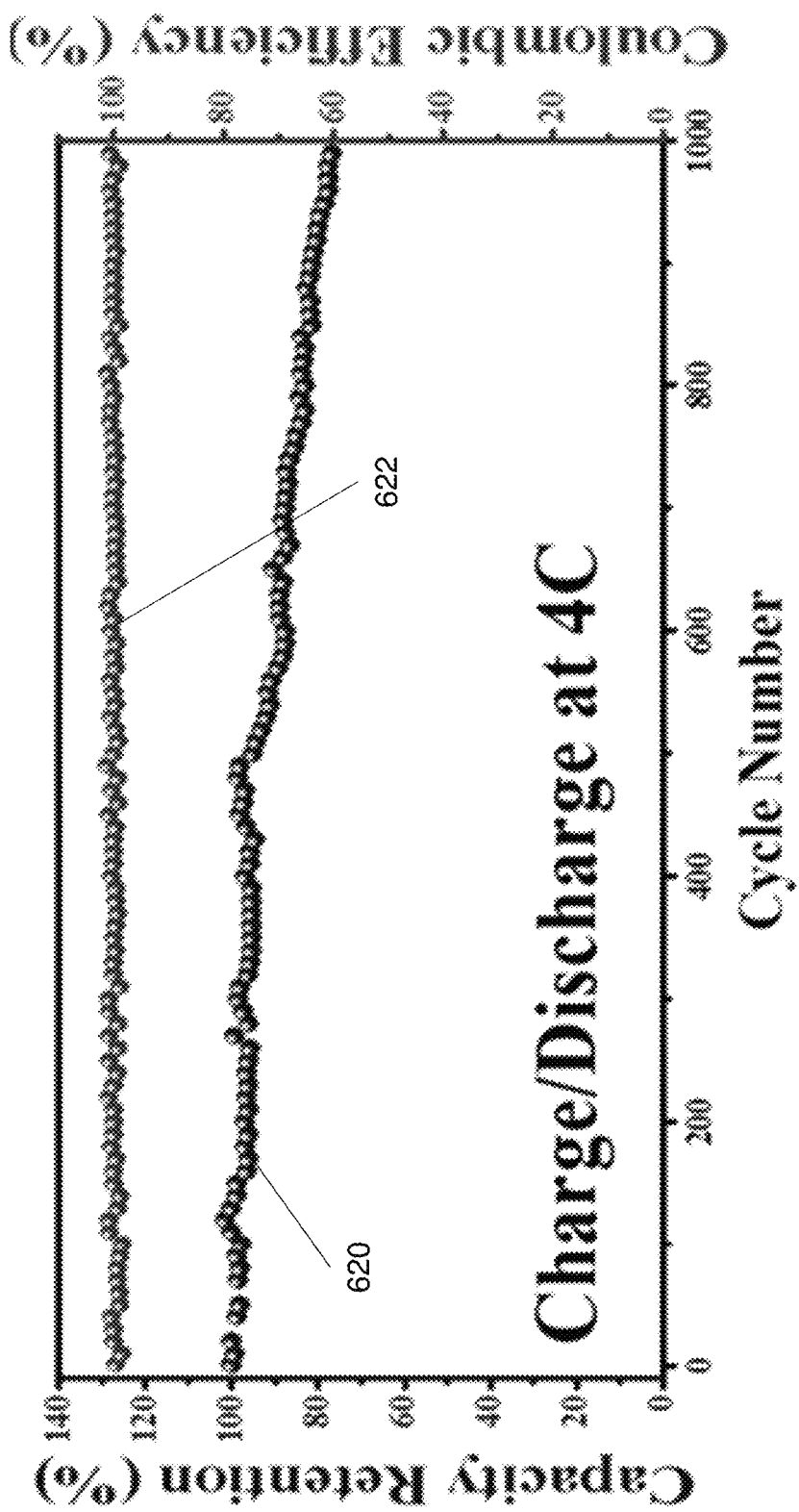
FIG. 6b shows results of a cyclic stability test of the zinc ion cell at charge density of 4 C for 1000 cycles, for the gel electrolyte.

FIG. 6b shows results of a cyclic stability test of the cell 106 at charge density of 4 C for 1000 cycles, for the gel electrolyte. The gel electrolyte is advantageous because it provides a more stable electrolyte thereby providing a more stable cell and increased stability in the performance of the cell at different operating conditions. The first curve 620 corresponds to the percentage capacity retention while curve 622 corresponds to percentage coulombic efficiency. As can be seen from FIG. 6b the cell 106 retains a 76.9% capacity retention. The percentage coulombic efficiency is stable. The cell 106 is rechargeable and using carbon cloth current collector and gelatin based gel electrolyte exhibits good electrochemical performance and can be used as flexible energy storage device.

Figure 7:
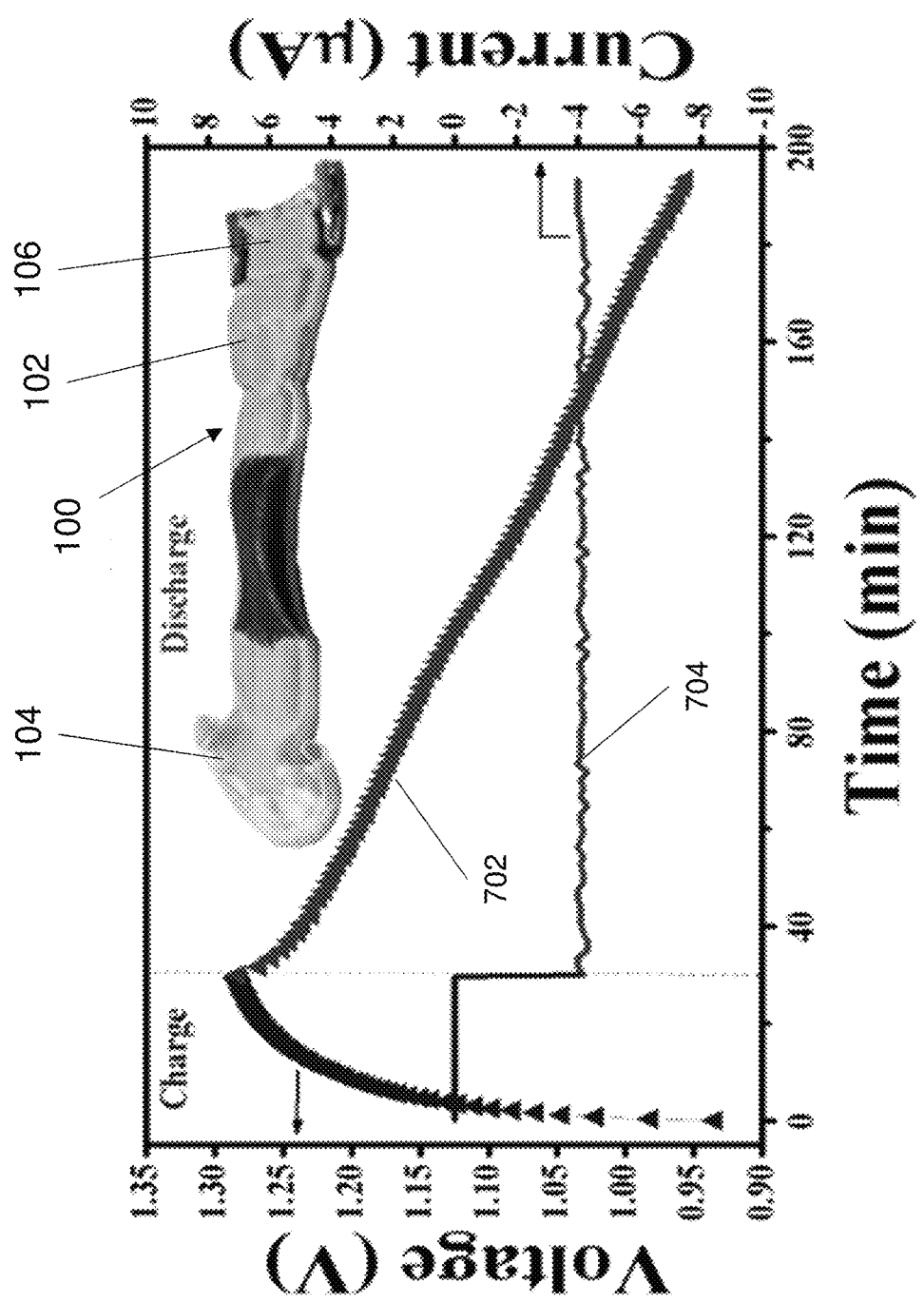
FIG. 7 illustrates a charge and discharge curve of the zinc ion cell when coupled to the TENG device.

FIG. 7 illustrates a charge and discharge curve of the cell 106 when coupled to the TENG device 104, and wherein the TENG device 104 is functioning as the power source under a hand press. As shown in FIG. 7, curve 702 is a curve illustrating the voltage curve showing the voltage received by the cell as voltage is generated by the TENG device 104 and the voltage discharged by cell 106. Curve 704 illustrates the current build up in the cell during the charging cycle and the release of current during the discharge phase. As seen in FIG. 7, the voltage of the cell 106 increases from 0.93V to 1.28V under a hand press within approximately 29 mins. The cell 106 then discharges at approximately 4 micro amps for 163.3 mins, delivering a discharge capacity of 10.9 µAh. FIG. 7 demonstrates the successful integration of the TENG device 104 and the cell 106 to create an integrated energy harvesting and energy storage apparatus 100. FIG. 7 also illustrates the apparatus 100 including the energy harvesting device 104, the energy storage device 106 and the substrate 102 supporting the harvesting device 104 and the storage device 106.

Some alternative embodiments of the energy harvesting and energy storage apparatus will now be described in more detail.

In an alternative embodiment the flexible substrate 102 may be formed from a 2D fabric or a 3D mesh fabric, as an alternative to 3D spacer fabric. The substrate 102 is preferably made of a fabric to provide a flexible substrate that can be easily incorporated into other items that can be worn e.g. garments. Any suitable natural fabrics or synthetic fabrics may be used to form the substrate 102. Some examples are cotton, nylon, polyester etc. The energy harvesting device and energy storage device may be similar to the embodiment shown in FIG. 1 and disposed on the flexible substrate. The energy harvesting device and the energy storage device may be formed onto other fabrics in a similar manner as described earlier.

In a further alternative embodiment the energy harvesting device 104 may comprise a plurality triboelectric nanogenerators disposed on the substrate 102. The plurality of triboelectric nanogenerators may be arranged in any suitable configuration. For example the triboelectric nanogenerators may be arranged in either a parallel or series arrangement. The energy harvesting device 104 may also comprise conditioning circuits and interfacing circuitry configured to receive electrical energy from the plurality of triboelectric nanogenerators and transfer the electrical energy to the electrically coupled energy storage device 106.

In another alternative embodiment the energy harvesting device 104 may comprise a piezoelectric based nanogenerator. The nanogenerator may include a piezoelectric component that converts kinetic energy to electrical energy. The piezoelectric component (or a plurality of piezoelectric components) may be arranged in any suitable configuration such as for example piezoelectric nanowire arrangement or piezoelectric fibres. Alternative materials for the nanogenerator may be Wurtzite, BaTiO3 (Pervoskite) or PVDF.

In a further alternative embodiment the energy harvesting device 104 may comprise a pyroelectric nanogenerator or a combination of a triboelectric nanogenerator and a pyroelectric generator. A pyroelectric nanogenerator is a device that is configured to convert external thermal energy into electrical energy. In this alternative embodiment the energy harvesting device 104 is configured to convert mechanical energy and thermal energy into electrical energy, due to the combination of a triboelectric nanogenerator and a pyroelectric nanogenerator. The electrical energy is transferred and stored in the connected electrical storage device.

In an alternative embodiment the energy storage device 106 may comprise a battery. The battery may comprise of a plurality of zinc ion cells as described earlier to form a zinc ion battery. The zinc ion battery is preferably constructed to be a rechargeable battery. The battery is preferably constructed such that it can be recharged from 0.9V to 1.3V in 30 mins or less. The zinc ion battery is also structured such that it can be charged and discharged at least 1000 times with at least 77% capacity retention. In this alternative embodiment the zinc ion battery may comprise a plurality of zinc ion cells described earlier to increase the performance of the battery beyond the performance parameters of a single cell.

The cell 106 as described earlier comprises a gelatin based gel electrolyte. However in an alternative embodiment the electrolyte may comprise an aqueous electrolyte comprising an aqueous solution of multiple compounds such as for example zinc sulfate and manganese sulfate compounds. Such an aqueous electrolyte may be used as an alternative to the gel electrolyte.

As described earlier the energy harvesting and energy storage apparatus can be used to power personal wearable electronics or wearable electronic devices. The integration of an energy harvesting device e.g. the TENG device and an energy storage device e.g. the zinc ion rechargeable cell provides a simple, compact, lightweight device to power wearable electronics while providing a stable power supply apparatus. The TENG device harvests mechanical energy and converts the mechanical energy to electrical energy that is used to charge the cell. The cell can then discharge and supply the stored electrical energy to any electrical components connected to the cell. The TENG device 104 being integrated with an directly coupled to the cell allows for harvesting of random mechanical energy as well mechanical energy due to movement of the substrate 102 while simultaneously charging the cell 106. This simultaneous harvesting of mechanical energy and charging the cell is advantageous as battery is charged due to the motion of the substrate without the need for any other power source. This makes the apparatus 100 particularly useful for use as a power source in wearable devices, as energy of the person wearing the device is harvested by the TENG device 104 and converted to electrical energy to charge the cell 106. Human motion is converted to an energy source to power wearable electronics. Further the electricity generated by the TENG device 104 can be stored in the cell 106 for future use.

The cell 106 also provides a device that provides a stable charging and discharge performance as described earlier due to the use of the gel electrolyte and the construction of the cell. The cell 106 can be charged and discharged for multiple cycles e.g. at least a 1000 cycles without significant degradation of performance. This provides a fairly useful long life power source that can be used in wearable electronics.

The TENG device 104 and the cell 106 are both integrally formed onto the substrate 102. The substrate 102 is a flexible fabric substrate i.e. a 3D spacer fabric. The TENG device 104 and cell 106 being formed integrally with the spacer fabric 102 provides a compact energy harvesting and energy storage apparatus. Further the TENG device 104 being integrally formed on the spacer fabric 102 allows the TENG device to move with the substrate 102 thereby increasing efficiency of transferring mechanical energy and reducing losses of mechanical energy. The substrate 102 being a 3D spacer fabric substrate 102 allows the substrate to be incorporated with other garments e.g. shirts, pants etc.

The spacer fabric substrate 102 can be incorporated into the garments by sewing the 3D spacer fabric into the garments. The structure of the apparatus 100 provides a wide range of applications especially in the wearable electronics field. The energy harvesting and energy storage apparatus 100 is advantageous because it can be sewn into any fabric or garment or any other device that incorporates fabric.

The description of any of these alternative embodiments is considered exemplary. Any of the alternative embodiments and features in the alternative embodiments can be used in combination with each other or with the embodiments described with respect to the figures.

The foregoing describes only a preferred embodiment of the present invention and modifications, obvious to those skilled in the art, can be made thereto without departing from the scope of the present invention. While the invention has been described with reference to a number of preferred embodiments it should be appreciated that the invention can be embodied in many other forms.

The invention claimed is:

1. An energy harvesting and storage apparatus comprising:
   a flexible substrate, wherein the flexible substrate is a single piece of spacer fabric comprising a first fabric layer and a second fabric layer with a support layer positioned between the first fabric layer and second fabric layer, the support layer maintaining the first fabric layer separated from the second fabric layer in an axial direction across a thickness of the spacer fabric;
   an energy harvesting device disposed on the flexible substrate, the energy harvesting device configured to convert mechanical energy generated in repeated contact-separation motions along the axial direction into electrical energy,
   an energy storage device disposed on the flexible substrate and in electrical communication with the energy harvesting device and configured to receive and store the electrical energy from the energy harvesting device;
   the energy harvesting device being positioned adjacent the energy storage device on the flexible substrate, to form an integrated energy harvesting and storage apparatus; and
   wherein the energy harvesting device and the energy storage device are formed on electrically separated portions of the spacer fabric.

2. An energy harvesting and storage apparatus in accordance with claim 1, wherein the energy storage device is a cell comprising an anode, a cathode spaced apart from the anode and an electrolyte positioned between and coupling the anode and cathode to allow charge transfer between the anode and cathode.

3. An energy harvesting and storage apparatus in accordance with claim 2, wherein the cell comprises a base layer disposed onto the flexible substrate, the anode located on the base layer, the electrolyte located on the anode, the cathode disposed on the electrolyte and an outer layer disposed on the cathode; and wherein the base layer and the outer layer comprises a carbon cloth.

4. An energy harvesting and storage apparatus in accordance with claim 2, wherein the cell is a zinc ion battery comprising a zinc anode, a manganese dioxide cathode.

5. An energy harvesting and storage apparatus in accordance with claim 2, wherein the anode comprises a zinc sheet, the cathode comprises a paste including manganese dioxide, acetylene black and polyvinylidene fluoride, the electrolyte comprises a gelatin based gel comprising at least zinc sulfate and/or manganese sulfate.

6. An energy harvesting and storage apparatus in accordance with claim 5, wherein the electrolyte is injected into the middle of the anode and the cathode.

7. An energy harvesting and storage apparatus in accordance with claim 2, wherein both the anode and the cathode are formed on both the first fabric layer and the second fabric layer.

8. An energy harvesting and storage apparatus in accordance with claim 1, wherein the energy harvesting device comprises a nanogenerator that is configured to convert mechanical energy of the flexible substrate into electrical energy.

9. An energy harvesting and storage apparatus in accordance with claim 8, wherein the nanogenerator comprises a triboelectric nanogenerator.

10. An energy harvesting and storage apparatus in accordance with claim 9, wherein the triboelectric nanogenerator comprises a first graphene electrode and a second polytetrafluoroethylene(PTFE) electrode.

11. An energy harvesting and storage apparatus in accordance with claim 9, wherein the triboelectric nanogenerator is configured to convert random mechanical energy from the environment and human motion to electrical energy for storage within the cell.

12. An energy harvesting and storage apparatus in accordance with claim 1, wherein the energy storage device is coupled to the energy harvesting device in a series arrangement or in a parallel arrangement.

13. An energy harvesting and storage apparatus in accordance with claim 1, wherein the energy harvesting device comprises a plurality of triboelectric nanogenerators located on the flexible substrate.

14. An energy harvesting and storage apparatus in accordance with claim 1, wherein the first and second fabric layers comprise nylon and the support layer comprises polyester.

15. An energy harvesting and storage apparatus in accordance with claim 1, wherein the energy harvesting and energy storage apparatus is configured to provide electrical energy to an electrical circuit that is connected to the energy harvesting and energy storage apparatus.

16. An energy harvesting and storage apparatus in accordance with claim 15, wherein the energy harvesting device is formed on a separate portion of the substrate to the energy storage device.

17. An energy harvesting and storage apparatus in accordance with claim 1, wherein with another aspect, the present disclosure relates to a garment comprising the energy harvesting and energy storage apparatus.

18. An energy harvesting and storage apparatus in accordance with claim 17, wherein the garment is a wearable garment.

19. An energy harvesting and storage apparatus in accordance with claim 17, wherein the garment comprises a portion of spacer fabric, wherein a region of the spacer fabric forms the flexible substrate of the energy harvesting and energy storage apparatus.

20. An energy harvesting and storage apparatus in accordance with claim 1, wherein the present disclosure relates to a wearable power supply unit for use with an electronic circuit comprising the energy harvesting and energy storage apparatus.

21. An energy harvesting and storage apparatus in accordance with claim 20, wherein the wearable power supply is positioned on a wearable garment.

22. An energy harvesting and storage apparatus in accordance with claim 1, wherein the energy harvesting device and the energy storage device are formed on the flexible substrate by electrodeposition.

* * * * *